(12) United States Patent
Luo et al.

(10) Patent No.: US 7,180,804 B1
(45) Date of Patent: Feb. 20, 2007

(54) HIGH PERFORMANCE SENSE AMPLIFIER AND METHOD THEREOF FOR MEMORY SYSTEM

(75) Inventors: Wenzhe Luo, Shanghai (CN); Paul Ouyang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 11/253,052

(22) Filed: Oct. 17, 2005

(30) Foreign Application Priority Data

Sep. 22, 2005 (CN) .................... 2005 1 0030004

(51) Int. Cl.
G11C 7/02 (2006.01)

(52) U.S. Cl. .................... 365/208; 365/207; 327/52; 327/53

(58) Field of Classification Search ............... 365/208
See application file for complete search history.

(56) References Cited

U.S. PATENT DOCUMENTS

| | | | |
|---|---|---|---|
| 5,175,451 A * | 12/1992 | Ihara | 327/54 |
| 6,011,413 A * | 1/2000 | Hayakawa et al. | 327/51 |
| 6,205,073 B1 * | 3/2001 | Naji | 365/209 |
| 6,600,690 B1 * | 7/2003 | Nahas et al. | 365/210 |
| 7,038,959 B2 * | 5/2006 | Garni | 365/203 |
| 2005/0068807 A1 * | 3/2005 | Ohsawa | 365/185.2 |
| 2006/0126389 A1 * | 6/2006 | Sarig | 365/185.21 |

* cited by examiner

*Primary Examiner*—Son L. Mai
(74) *Attorney, Agent, or Firm*—Townsend and Townsend and Crew LLP (57) ABSTRACT

A system and method for sensing a current. The system includes an operational amplifier including a first input terminal, a second input terminal, and a first output terminal. The first input terminal is biased to a predetermined voltage, and the second input terminal and the first output terminal are directly connected. Additionally, the system includes a switch coupled to the first output terminal and a first node. The switch is controlled by at least a first control signal. Moreover, the system includes a comparator including a third input terminal, a fourth input terminal, and at least a second output terminal. The comparator is configured to receive a first input signal at the third input terminal and a second input signal at the fourth input terminal. The first input signal and the second input signal are associated with the first node and the predetermined voltage.

20 Claims, 4 Drawing Sheets

HIGH PERFORMANCE SENSE AMPLIFIER AND METHOD THEREOF FOR MEMORY SYSTEM

CROSS-REFERENCES TO RELATED APPLICATIONS

This application claims priority to Chinese Patent Application No. 200510030004.5, filed Sep. 22, 2005, commonly assigned, incorporated by reference herein for all purposes.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to integrated circuits. More particularly, the invention provides a system and method for high performance sense amplifier. Merely by way of example, the invention has been applied to a memory system. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as a given process, device layout, and/or system design often work down to only a certain feature size.

An example of such a limit is performance of a sense amplifier. The sensitivity of the sense amplifier affects read operations of a memory system. For a read-only memory (ROM) system, when the devices becomes smaller, the cell current may also become lower. The low cell current often slows down the read operations of the memory system, whose read operations may also become less accurate.

From the above, it is seen that an improved technique for sense amplifier is desired.

BRIEF SUMMARY OF THE INVENTION

The present invention is directed to integrated circuits. More particularly, the invention provides a system and method for high performance sense amplifier. Merely by way of example, the invention has been applied to a memory system. But it would be recognized that the invention has a much broader range of applicability.

In a specific embodiment, the invention provides a system for sensing a current. The system includes an operational amplifier including a first input terminal, a second input terminal, and a first output terminal. The first input terminal is biased to a predetermined voltage, and the second input terminal and the first output terminal are directly connected. Additionally, the system includes a switch coupled to the first output terminal and a first node. The switch is controlled by at least a first control signal. Moreover, the system includes a comparator including a third input terminal, a fourth input terminal, and at least a second output terminal. The comparator is configured to receive a first input signal at the third input terminal and a second input signal at the fourth input terminal. The first input signal and the second input signal are associated with the first node and the predetermined voltage. Also, the system includes a current generator coupled to a second node and configured to generate a first current. The first current flows between the current generator and the second node. The first node and the second node are directly connected, and a second current flows between the first node and the second node. The second node is coupled to a device configured to generate a third current, and the third current flows between the device and the second node.

According to another embodiment of the present invention, a system for sensing a current includes an operational amplifier including a first input terminal, a second input terminal, and a first output terminal. The first input terminal is biased to a predetermined voltage, and the second input terminal and the first output terminal are directly connected. Additionally, the system includes a switch coupled to the first output terminal and a first node, and the switch is controlled by at least a first control signal. Moreover, the system includes a comparator including a third input terminal, a fourth input terminal, and at least a second output terminal. The comparator is configured to receive a first input signal at the third input terminal and a second input signal at the fourth input terminal, and the first input signal and the second input signal being associated with the first node and the predetermined voltage. Also, the system includes a reference generator configured to generate a predetermined current, and a current mirror coupled to the reference generator and a second node and configured to generate a first current. The first current is proportional to the predetermined current. The predetermined current flows from the current mirror to the reference generator, and the first current flows from the current mirror to the second node. The first node and the second node are directly connected. A second current flows between the first node and the second node, and the second node is coupled to a bit line for a memory system. The memory system is configured to generate no current on the bit line or a third current on the bit line. If the memory system generates no current on the bit line, the second current flows from the second node to the first node. If the memory system generates the third current on the bit line, the second current flows from the first node to the second node.

According to yet another embodiment of the present invention, a method for sensing a current includes selecting a memory cell in a memory system. The selected memory cell corresponds to at least a selected bit line, and the memory system is coupled to a sense amplifier. The sense amplifier includes an operational amplifier including a first output terminal substantially biased to a predetermined voltage, a switch coupled to the first output terminal and a first node and controlled by at least a first control signal, a comparator including a first input terminal and a second input terminal, a current generator coupled to a second node and configured to generate a first current flowing between the current generator and the second node. The second node is coupled to the selected bit line, and the first node and the second node are directly connected. The first input terminal and the second input terminal are associated with the first node and the predetermined voltage. Additionally, the method includes turning on the switch by at least the first control signal, adjusting a voltage level at the first node to be substantially equal to the predetermined voltage, and turning off the switch by at least the first control signal. Moreover, the method includes increasing or decreasing the voltage level at the first node from being substantially equal to the predetermined voltage, and detecting a difference between the voltage level at the first node and the predetermined voltage. The selected memory cell is at either a first state or a second state. The increasing or decreasing the voltage level at the first node includes if the selected memory cell is at the fist state increasing the voltage level, and if the selected memory cell is at the second state decreasing the voltage level.

Many benefits are achieved by way of the present invention over conventional techniques. Some embodiments of the present invention provide a system and method for sensitive and fast sense amplifier. For example, the sense amplifier uses an operational amplifier to pre-charge a selected bit line to a reference voltage through an anti-charge-injection switch. After the pre-charging, the bit-line voltage would remain very close to the reference voltage. Certain embodiments of the present invention significantly facilitate read operations of read-only memory (ROM) systems that have low currents. For example, the sensitivity of the read operations are significantly improved. In another example, the speed of the read operations are significantly improved. Some embodiments of the present invention use an operational amplifier to automatically balance a selected bit line to a reference voltage during pre-charging. Certain embodiments of the present invention uses an anti-charge-injection switch to control a pre-charging process of a selected bit line. At the end of pre-charging, the anti-charge-injection switch is turned off. For example, the anti-charge-injection switch includes a switching transistor, and the charge injection cancellation transistors. Without the charge injection cancellation transistors, the electrons in the inversion layer of the switching transistor are dispersed to the both side of the switching transistor and make the voltage level of the selected bit line jump. Some embodiments of the present invention can detect a current by allowing the current to change the voltage level at one terminal of a comparator from the pre-charged voltage level. For example, the pre-charged voltage level is substantially equal to the reference voltage. In another example, the comparator compares the changing voltage level to the reference voltage for zero-crossing detection.

Various additional objects, features and advantages of the present invention can be more fully appreciated with reference to the detailed description and accompanying drawings that follow.

DETAILED DESCRIPTION OF THE INVENTION

The present invention is directed to integrated circuits. More particularly, the invention provides a system and method for high performance sense amplifier. Merely by way of example, the invention has been applied to a memory system. But it would be recognized that the invention has a much broader range of applicability.

Figure 1:
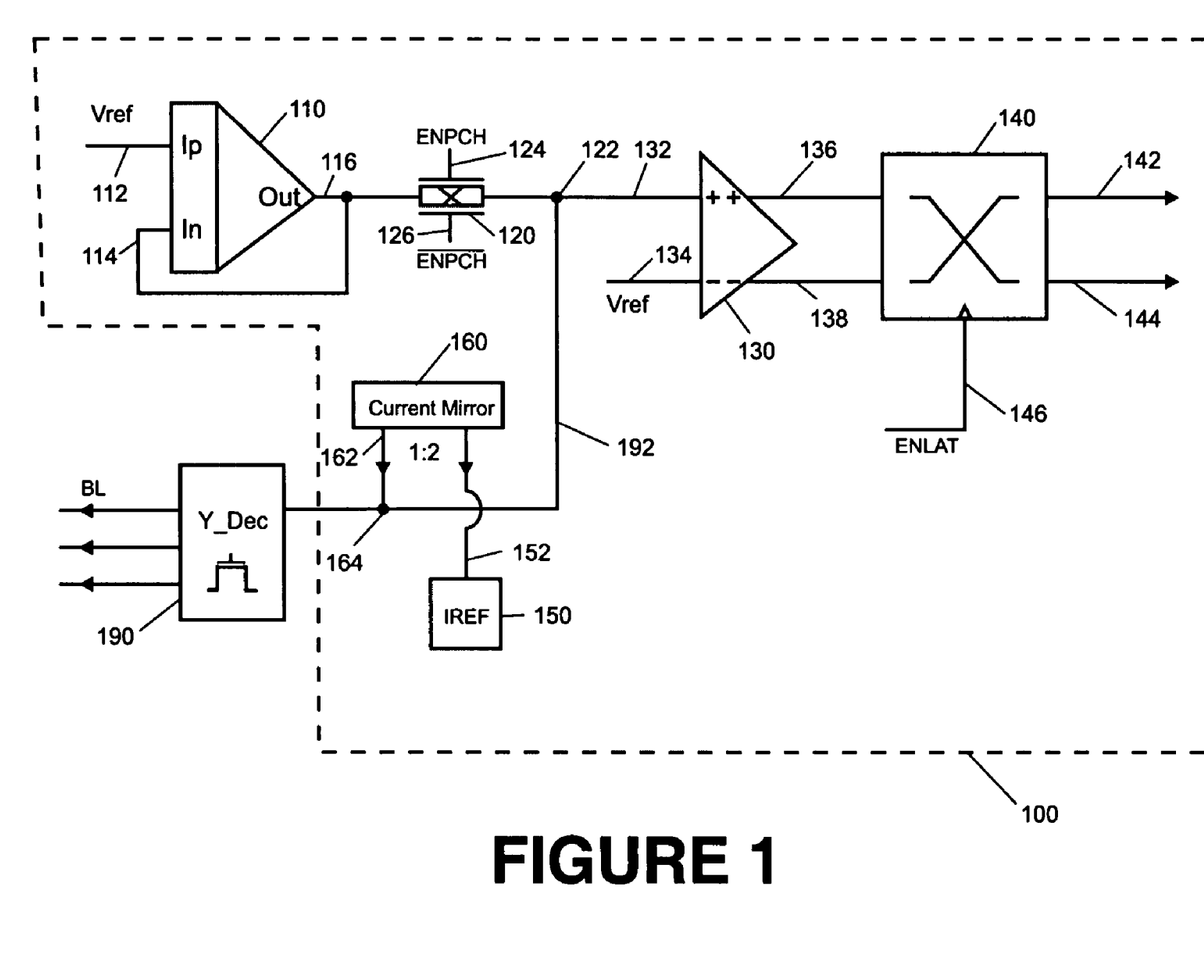
FIG. 1 is a simplified sense amplifier according to an embodiment of the present invention.

FIG. 1 is a simplified sense amplifier according to an embodiment of the present invention. This diagram is merely an example, which should not unduly limit the scope of the claims. One of ordinary skill in the art would recognize many variations, alternatives, and modifications. The system 100 includes the following components:

1. Operational amplifier 110;
2. Switch 120;
3. Amplifier 130;
4. Comparator 140;
5. Current reference device 150;
6. Current mirror 160.

Although the above has been shown using a selected group of components for the system 100, there can be many alternatives, modifications, and variations. For example, some of the components may be expanded and/or combined. Other components may be inserted to those noted above. Depending upon the embodiment, the arrangement of components may be interchanged with others replaced. For example, the system 100 serves as a sense amplifier. Further details of these components are found throughout the present specification and more particularly below.

The operational amplifier 110 includes a positive input terminal 112, a negative input terminal 114, and an output terminal 116. The positive input terminal 112 receives a reference voltage $V_{ref}$, and the negative input terminal 114 is connected to the output terminal 116. For example, the operational amplifier 110 acts as a unit-gain buffer. The output terminal 116 sends out an output voltage. For example, the output voltage is substantially equal to the reference voltage $V_{ref}$.

Figure 2:
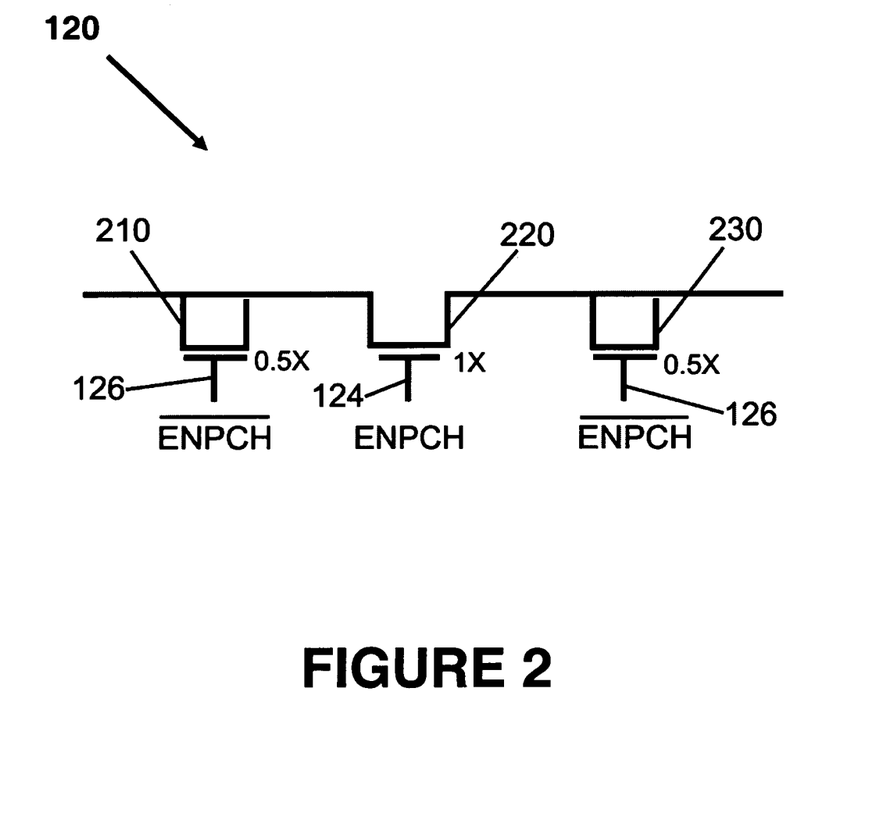
FIG. 2 is a simplified diagram showing a switch for a system according to an embodiment of the present invention.

The switch 120 controls the connection between the output terminal 116 and a node 122 in response to control signals 124 and 126. For example, the control signals 124 and 126 are complementary to each other. In another example, the control signal 124 is called ENPCH. FIG. 2 is a simplified diagram showing the switch 120 for the system 100 according to an embodiment of the present invention. This diagram is merely an example, which should not unduly limit the scope of the claims. One of ordinary skill in the art would recognize many variations, alternatives, and modifications. The switch 120 includes transistors 210, 220, and 230. Although the above has been shown using a selected group of components for the switch 120, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

The transistors 210 and 230 are controlled by the control signal 126, and the transistor 220 is controlled by the control signal 124. For example, the control signal 124 is an ENPCH signal, and the control signal 126 is complementary to the ENPCH signal. If the control signal 124 represents a logic high level, the control signal 126 represents a logic low level. If the control signal 124 represents a logic low level, the control signal 126 represents a logic high level. In another example, the source and the drain of the transistor 210 are shorted, and the source and the drain of the transistor 230 are also shorted. In yet another example, the switch is an anti-charge-injection switch. In yet another example, the source or drain of the transistor 210 is coupled to the output terminal 116, and the source or drain of the transistor 230 is coupled to the node 122.

In one embodiment, the transistor 220 performs the switching function for the switch 120. In another embodiment, the transistors 210 and 230 perform the charge injection cancellation function for the switch 120. In yet another embodiment, the transistors 210, 220, and 230 are NMOS transistors. If the control signal 124 is at the logic high level, the switch 120 is closed. The voltage level of the node 122 is adjusted to the output voltage of the output terminal 116. For example, the output voltage of the output terminal 116 is substantially equal to the reference voltage $V_{ref}$ as shown in FIG. 1. If the control signal 124 is at the logic low level, the transistor 220 is turned off, and the switch 120 is open. Also, the transistors 210 and 230 are turned on. For example, the electrons are released from the inversion layer of the transistor 220 and absorbed by the transistors 210 and 230. In yet another embodiment, the transistors 210, 220, and 230 have the same length, but the width of the transistor 210 and the width of the transistor 230 each are half of the width of the transistor 220. For example, the electrons released from the inversion layer of the transistor 220 are about evenly dispersed to the transistors 210 and 230.

The amplifier 130 includes input terminals 132 and 134 and output terminals 136 and 138. For example, the input terminal 132 is biased to the voltage level of the node 122, and the input terminal 134 is biased to the reference voltage $V_{ref}$. The amplifier 130 determines and amplifies the signal difference between the input terminals 132 and 134, and the amplified difference is output at the terminals 136 and 138. For example, the signals at the output terminals 136 and 138 have the same magnitude but different polarities. In another example, the signals at the output terminals 136 and 138 are in the voltage domain. In yet another embodiment, if the voltage at the input terminal 132 is higher than the voltage at the input terminal 134, the voltage at the output terminal 136 is higher than the voltage at the output terminal 138. In yet another embodiment, if the voltage at the input terminal 132 is lower than the voltage at the input terminal 134, the voltage at the output terminal 136 is lower than the voltage at the output terminal 138. In yet another embodiment, the voltage difference between the terminals 136 and 138 is significantly larger in magnitude than the voltage difference between the terminals 132 and 134. For example, this amplification can improve easiness and reliability of the comparison performed by the comparator 140.

The comparator 140 is coupled to the terminals 136 and 138, and includes output terminals 142 and 144 and a control terminal 146. In one embodiment, the control terminal 146 receives a control signal, such as the ENLAT signal. In another embodiment, the comparator 140 receives signals from the terminals 136 and 138 and compares the received signals to generate signals at the terminals 142 and 144. In yet another embodiment, the signals at the terminals 142 and 144 each are at the logic high level or the logic low level, and the signals at the terminals 142 and 144 are complementary. For example, if the voltage at the terminal 136 is higher than the voltage at the terminal 138, the signal at the terminal 142 represents "1" and the signal at the terminal 144 represents "0". In another example, if the voltage at the terminal 136 is lower than the voltage at the terminal 138, the signal at the terminal 142 represents "0" and the signal at the terminal 144 represents "1". In one embodiment, "1" corresponds to a voltage level of $V_{DD}$, and "0" corresponds to a voltage level of $V_{SS}$. In yet another embodiment, the comparator 140 differentiates the signals at the terminals 136 and 138 to the full swing with positive feedback. In yet another embodiment, the comparator 140 is a latch comparator. For example, the latch comparator includes a plurality of latches in cascade.

The current reference device 150 generates a sinking current 152 of $I_{ref}$. The sinking current 152 flows to the current reference device 150 from the current mirror 160. In response, the current mirror 160 generates a sourcing current 162. The sourcing current 162 flows from the current mirror 160 to a node 164. For example, the current 162 is half as large as the current 152 in magnitude. In another example, the current reference device 150 and the current mirror 160 form a current generator.

As shown in FIG. 1, the terminals 142 and 144 serve as output terminals of the system 100, and the node 164 serves as an input node of the system 100. In one embodiment, the system 100 serves as a sense amplifier, which is coupled to a memory system. For example, the memory system includes a read-only memory (ROM) system, such as an NAND ROM system or a flash memory system. In another example, the memory system includes word lines, bit lines, a decoder 190. The decoder 190 includes switches for connecting a selected bit line to the input node 164. For example, a bit line is selected, and a word line is also selected. The selected word line and the selected bit line correspond to a memory cell. The selected memory cell can generate a current $I_0$ flowing into the memory system from the sense amplifier 100 or generate no current based on information stored at the memory cell. For example, if the memory cell stores "0", the current is equal to 10. In another example, if the memory cell stores "1", the current is equal to zero. In one embodiment, the magnitude of the current $I_{ref}$ is approximately equal to the average magnitude of the current $I_0$ for memory cells storing "0".

Figure 3:
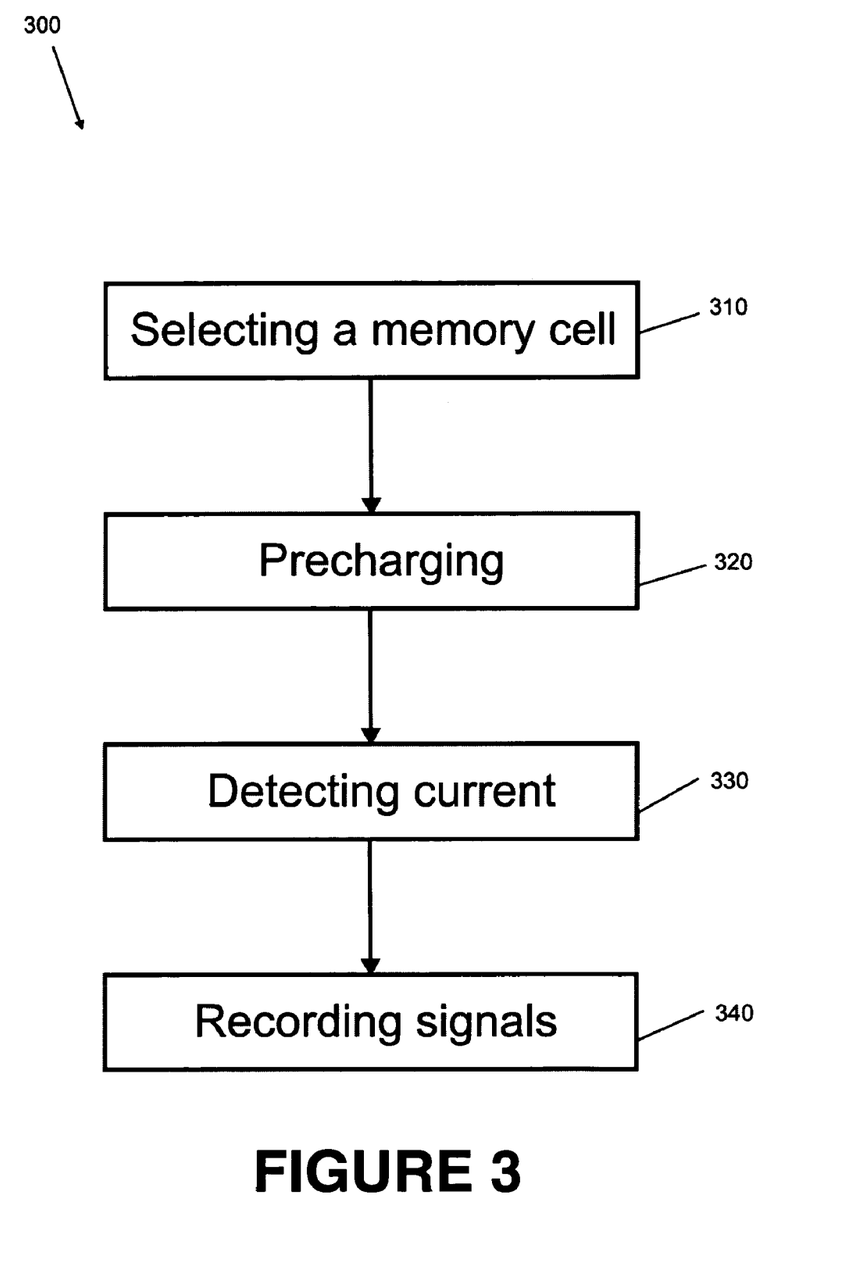
FIG. 3 is a simplified method for sensing current of a memory system according to an embodiment of the present invention.

FIG. 3 is a simplified method for sensing current of a memory system according to an embodiment of the present invention. This diagram is merely an example, which should not unduly limit the scope of the claims. One of ordinary skill in the art would recognize many variations, alternatives, and modifications. The method 300 includes the following processes:

1. Process 310 for selecting a memory cell;
2. Process 320 for precharging;
3. Process 330 for detecting current;
4. Process 340 for recording signals.

Although the above has been shown using a selected group of processes for the method 300, there can be many alternatives, modifications, and variations. For example, some of the processes may be expanded and/or combined. Other processes may be inserted to those noted above. Depending upon the embodiment, the arrangement of processes may be interchanged with others replaced. For example, the method 300 is performed by the sense amplifier 100 coupled to the decoder 190. Further details of these processes are found throughout the present specification and more particularly below.

At the process 310, a memory cell is selected. For example, a bit line is selected, and a word line is also selected. The selected word line and the selected bit line correspond to a selected memory cell. In another example, the voltage level of the selected word-line is at the logic high level, and the voltage levels of all other word lines is at the logic low level. In yet another example, the selected bit line is connected with the node 164 as shown in FIG. 1.

At the process 320, the selected bit line is pre-charged. In one embodiment, the switch 120 is turned on, and the voltage level of the node 122 is adjusted to the output voltage of the output terminal 116. Accordingly, the selected bit line is also charged through the switch 120 and the decoder 190. The voltage level of the selected bit line is substantially equal to $V_{REF}$. For example, the operational amplifier 110 has a high gain, and the difference between voltage level of the selected bit line and the reference voltage $V_{REF}$ is within 3 to 5 mV. The process 320 ends when the switch 120 is turned off.

At the process 330, the current of the selected memory cell is detected. For example, the selected memory cell can generate a current $I_0$ flowing into the memory system from the sense amplifier 100 or generate no current based on information stored at the memory cell. In one embodiment, if the memory cell stores "0", the current is equal to $I_0$. In another embodiment, if the memory cell stores "1", the current is equal to zero.

If the selected memory cell generates the current $I_0$ flowing into the memory system, a current 192 flowing from the node 122 to the node 164 is equal to the current 10 minus the current 162. For example, the current 162 is equal to half of the current 152, and the current 192 is equal to $I_0 - 0.5 \times I_{ref}$. Accordingly, the voltage level of the node 122 decreases with time from the reference voltage $V_{ref}$. For example, the voltage level of the node 122 drops by approximately a rate of $i/C_{b1}$. i represents the magnitude of the current 192, and $C_{b1}$ represents the total capacitance of the selected bit line and the line between the nodes 122 and 164.

If the selected memory cell generates no current, the current 192 flows from the node 164 to the node 122 and is equal to the magnitude of current 162. For example, the current 162 is equal to half of the current 152, and the current 192 is equal to $0.5 \times I_{ref}$ in magnitude. Accordingly, the voltage level of the node 122 increases with time from the reference voltage $V_{ref}$. For example, the voltage level of the node 122 rises by approximately a rate of $i/C_{b1}$. i represents the magnitude of the current 192, and $C_{b1}$ represents the total capacitance of the selected bit line and the line between the nodes 122 and 164.

At the process 340, signals that are related to the detected current are recorded. As shown in FIG. 1, the difference between the voltage level at the node 122 and the reference voltage $V_{ref}$ is amplified by the amplifier 130. The amplifier 130 outputs two differential signals at the terminals 136 and 138, which are received by the comparator 140. For example, the comparator 140 compares, amplifies, and stores the received signals in response to the control signal at the terminal 146. In one embodiment, the signals are compared and amplified when the ENLAT signal is at the logic high level, and the amplified signals are preserved when the ENLAT signal is at the logic low level.

Figure 4:
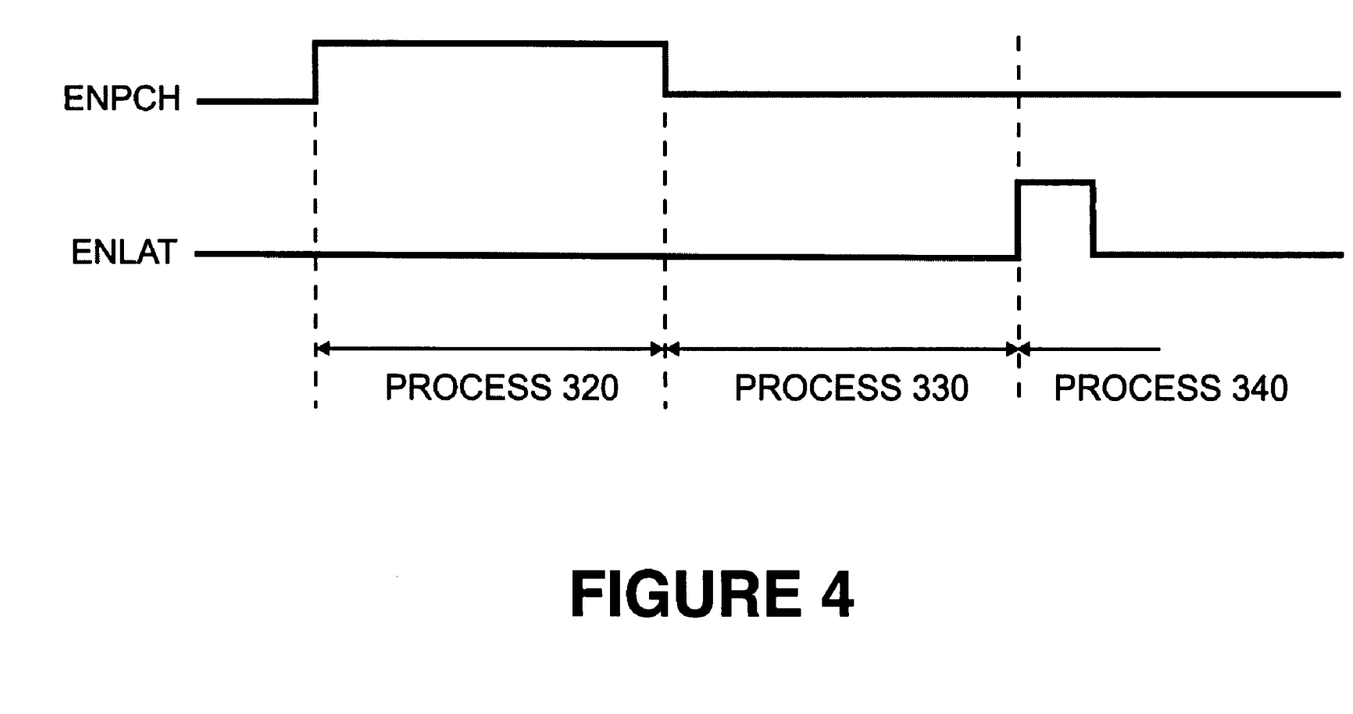
FIG. 4 is a simplified diagram showing control signals for a method for sensing current of a memory system according to an embodiment of the present invention.

FIG. 4 is a simplified diagram showing control signals for the method 300 according to an embodiment of the present invention. This diagram is merely an example, which should not unduly limit the scope of the claims. One of ordinary skill in the art would recognize many variations, alternatives, and modifications. As discussed above, the sense amplifier 100 is controlled by the signals 124, 126, and 146. For example, the signals 124 and 126 are determined by the ENPCH signal, and the signal 128 is determined by the ENLAT signal. During the process 320, the ENPCH signal remains at the logic high level, and the ENLAT signal remains at the logic low level. For example, the ENPCH signal turns on the switch 120. In another example, the time period for the process 320 ranges from 3 ns to 30 ns. During the process 330, both the ENPCH signal and the ENLAT signal remain at the logic low level. For example, the time period for the period 330 ranges from 5 ns to 30 ns. During the process 340, the ENPCH signal remains at the logic low level. The ENLAT signal rises to the logic high level and after a period of time drops to the logic low level.

According to another embodiment of the present invention, a system for sensing a current includes an operational amplifier including a first input terminal, a second input terminal, and a first output terminal. The first input terminal is biased to a predetermined voltage, and the second input terminal and the first output terminal are directly connected. Additionally, the system includes a switch coupled to the first output terminal and a first node. The switch is controlled by at least a first control signal. Moreover, the system includes a comparator including a third input terminal, a fourth input terminal, and at least a second output terminal. The comparator is configured to receive a first input signal at the third input terminal and a second input signal at the fourth input terminal. The first input signal and the second input signal are associated with the first node and the predetermined voltage. Also, the system includes a current generator coupled to a second node and configured to generate a first current. The first current flows between the current generator and the second node. The first node and the second node are directly connected, and a second current flows between the first node and the second node. The second node is coupled to a device configured to generate a third current, and the third current flows between the device and the second node. For example, the system is implemented according to the system 100.

According to yet another embodiment of the present invention, a system for sensing a current includes an operational amplifier including a first input terminal, a second input terminal, and a first output terminal. The first input terminal is biased to a predetermined voltage, and the second input terminal and the first output terminal are directly connected. Additionally, the system includes a switch coupled to the first output terminal and a first node, and the switch is controlled by at least a first control signal. Moreover, the system includes a comparator including a third input terminal, a fourth input terminal, and at least a second output terminal. The comparator is configured to receive a first input signal at the third input terminal and a second input signal at the fourth input terminal, and the first input signal and the second input signal being associated with the first node and the predetermined voltage. Also, the system includes a reference generator configured to generate a predetermined current, and a current mirror coupled to the reference generator and a second node and configured to generate a first current. The first current is proportional to the predetermined current. The predetermined current flows from the current mirror to the reference generator, and the first current flows from the current mirror to the second node. The first node and the second node are directly connected. A second current flows between the first node and the second node, and the second node is coupled to a bit line for a memory system. The memory system is configured to generate no current on the bit line or a third current on the bit line. If the memory system generates no current on the bit line, the second current flows from the second node to the first node. If the memory system generates the third current on the bit line, the second current flows from the first node to the second node. For example, the system is implemented according to the system 100.

According to yet another embodiment of the present invention, a method for sensing a current includes selecting a memory cell in a memory system. The selected memory cell corresponds to at least a selected bit line, and the memory system is coupled to a sense amplifier. The sense amplifier includes an operational amplifier including a first output terminal substantially biased to a predetermined voltage, a switch coupled to the first output terminal and a first node and controlled by at least a first control signal, a comparator including a first input terminal and a second input terminal, a current generator coupled to a second node and configured to generate a first current flowing between the current generator and the second node. The second node is coupled to the selected bit line, and the first node and the second node are directly connected. The first input terminal and the second input terminal are associated with the first node and the predetermined voltage. Additionally, the method includes turning on the switch by at least the first control signal, adjusting a voltage level at the first node to be substantially equal to the predetermined voltage, and turning off the switch by at least the first control signal. Moreover, the method includes increasing or decreasing the voltage level at the first node from being substantially equal to the predetermined voltage, and detecting a difference between the voltage level at the first node and the predetermined voltage. The selected memory cell is at either a first state or a second state. The increasing or decreasing the voltage level at the first node includes if the selected memory cell is at the fist state increasing the voltage level, and if the selected memory cell is at the second state decreasing the voltage level. For example, the method is implemented according to the method 300.

The present invention has various advantages. Some embodiments of the present invention provide a system and method for sensitive and fast sense amplifier. For example, the sense amplifier uses an operational amplifier to pre-charge a selected bit line to a reference voltage through an anti-charge-injection switch. After the pre-charging, the bit-line voltage would remain very close to the reference voltage. Certain embodiments of the present invention significantly facilitate read operations of read-only memory (ROM) systems that have low currents. For example, the sensitivity of the read operations are significantly improved. In another example, the speed of the read operations are significantly improved. Some embodiments of the present invention use an operational amplifier to automatically balance a selected bit line to a reference voltage during pre-charging. Certain embodiments of the present invention uses an anti-charge-injection switch to control a pre-charging process of a selected bit line. At the end of pre-charging, the anti-charge-injection switch is turned off. For example, the switch 120 is an anti-charge-injection switch. In another example, the switch 120 includes the transistors 210, 220, and 230. In one embodiment, the transistor 220 serves as a switching transistor, and the transistors 230 and 240 serve as the charge injection cancellation transistors. Without the charge injection cancellation transistors, the electrons in the inversion layer of the switching transistor are dispersed to the both side of the switching transistor and make the voltage level of the selected bit line jump. Some embodiments of the present invention can detect a current by allowing the current to change the voltage level at one terminal of a comparator from the pre-charged voltage level. For example, the pre-charged voltage level is substantially equal to the reference voltage. In another example, the comparator compares the changing voltage level to the reference voltage for zero-crossing detection.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A system for sensing a current, the system comprising:
    an operational amplifier including a first input terminal, a second input terminal, and a first output terminal, the first input terminal being biased to a predetermined voltage, the second input terminal and the first output terminal being directly connected;
    a switch coupled to the first output terminal and a first node, the switch being controlled by at least a first control signal;
    a comparator including a third input terminal, a fourth input terminal, and at least a second output terminal, the comparator being configured to receive a first input signal at the third input terminal and a second input signal at the fourth input terminal, the first input signal and the second input signal being associated with the first node and the predetermined voltage;
    a current generator coupled to a second node and configured to generate a first current, the first current flowing between the current generator and the second node;
    wherein:
        the first node and the second node are directly connected;
        a second current flows between the first node and the second node;
        the second node is coupled to a device configured to generate a third current;
        the third current flows between the device and the second node.

2. The system of claim 1 wherein the current generator comprises:
    a reference generator configured to generate a predetermined current;
    a current mirror coupled to the reference generator and the second node and configured to generate the first current, the first current being proportional to the predetermined current, the predetermined current flowing between the current mirror and the reference generator.

3. The system of claim 1 wherein:
    the third current is capable of being associated with only either a first state or a second state;
    if the third current is associated with the first state, the second current flows from the first node to the second node;

if the third current is associated with the second state, the second current flows from the second node to the first node.

4. The system of claim 3 wherein:
the second current is associated with a current magnitude;
the current magnitude remains the same regardless of whether the third current is associated with the first state or the second state.

5. The system of claim 3 wherein:
the third current is associated with a current magnitude;
the current magnitude corresponding to the first state or the second state is equal to zero.

6. The system of claim 1, and further comprising a first amplifier including a fifth input terminal and a sixth input terminal, the fifth input terminal coupled to the first node, the sixth input terminal biased to the predetermined voltage, the first amplifier configured to generate the first input signal and the second input signal.

7. The system of claim 1 wherein the comparator is further configured to receive a second control signal and store and generate a third output signal and a fourth output signal in response to the second control signal.

8. The system of claim 7 wherein one of the third output signal and the fourth output signal represents a logic high level and the other one of the third output signal and the fourth output signal represents a logic low level.

9. The system of claim 1 wherein:
the switch includes a first transistor, a second transistor, and a third transistor;
the first transistor includes a first transistor terminal, a second transistor terminal, and a first transistor gate;
the second transistor includes a third transistor terminal, a fourth transistor terminal, and a second transistor gate;
the third transistor includes a fifth transistor terminal, a sixth transistor terminal, and a third transistor gate;
the first transistor terminal is coupled to the first output terminal;
the sixth transistor terminal is coupled to the first node;
the second transistor gate is configured to receive the second control signal;
each of the first transistor gate and the third transistor gate is configured to receive a third control signal, the third control signal being complementary to the second control signal.

10. The system of claim 9 wherein:
the first transistor terminal and the second transistor terminal are directly connected;
the fifth transistor terminal and the sixth transistor terminal are directly connected;
the second transistor terminal and the third transistor terminal are directly connected;
the fourth transistor terminal and the fifth transistor terminal are directly connected.

11. A system for sensing a current, the system comprising:
an operational amplifier including a first input terminal, a second input terminal, and a first output terminal, the first input terminal being biased to a predetermined voltage, the second input terminal and the first output terminal being directly connected;
a switch coupled to the first output terminal and a first node, the switch being controlled by at least a first control signal;
a comparator including a third input terminal, a fourth input terminal, and at least a second output terminal, the comparator being configured to receive a first input signal at the third input terminal and a second input signal at the fourth input terminal, the first input signal and the second input signal being associated with the first node and the predetermined voltage;
a reference generator configured to generate a predetermined current;
a current mirror coupled to the reference generator and a second node and configured to generate a first current, the first current being proportional to the predetermined current, the predetermined current flowing from the current mirror to the reference generator, the first current flowing from the current mirror to the second node;
wherein:
the first node and the second node are directly connected;
a second current flows between the first node and the second node;
the second node is coupled to a bit line for a memory system, the memory system configured to generate no current on the bit line or a third current on the bit line;
if the memory system generates no current on the bit line, the second current flows from the second node to the first node;
if the memory system generates the third current on the bit line, the second current flows from the first node to the second node.

12. The system of claim 11 wherein:
the second current is associated with a current magnitude;
the current magnitude remains the same regardless of whether the memory system generates no current on the bit line or the third current on the bit line.

13. The system of claim 11, and further comprising a first amplifier including a fifth input terminal and a sixth input terminal, the fifth input terminal coupled to the first node, the sixth input terminal biased to the predetermined voltage, the first amplifier configured to generate the first input signal and the second input signal.

14. The system of claim 11 wherein the comparator is further configured to receive a second control signal and store and generate a third output signal and a fourth output signal in response to the second control signal.

15. The system of claim 11 wherein:
the switch includes a first transistor, a second transistor, and a third transistor;
the first transistor includes a first transistor terminal, a second transistor terminal, and a first transistor gate;
the second transistor includes a third transistor terminal, a fourth transistor terminal, and a second transistor gate;
the third transistor includes a fifth transistor terminal, a sixth transistor terminal, and a third transistor gate;
the first transistor terminal is coupled to the first output terminal;
the sixth transistor terminal is coupled to the first node;
the second transistor gate is configured to receive the second control signal;
each of the first transistor gate and the third transistor gate is configured to receive a third control signal, the third control signal being complementary to the second control signal.

16. The system of claim 15 wherein:
the first transistor terminal and the second transistor terminal are directly connected;
the fifth transistor terminal and the sixth transistor terminal are directly connected;

the second transistor terminal and the third transistor terminal are directly connected;

the fourth transistor terminal and the fifth transistor terminal are directly connected.

17. A method for sensing a current, the method comprising:

selecting a memory cell in a memory system, the selected memory cell corresponding to at least a selected bit line, the memory system being coupled to a sense amplifier, the sense amplifier including an operational amplifier including a first output terminal substantially biased to a predetermined voltage, a switch coupled to the first output terminal and a first node and controlled by at least a first control signal, a comparator including a first input terminal and a second input terminal, a current generator coupled to a second node and configured to generate a first current flowing between the current generator and the second node, the second node being coupled to the selected bit line, the first node and the second node being directly connected, the first input terminal and the second input terminal being associated with the first node and the predetermined voltage;

turning on the switch by at least the first control signal;

adjusting a voltage level at the first node to be substantially equal to the predetermined voltage;

turning off the switch by at least the first control signal;

increasing or decreasing the voltage level at the first node from being substantially equal to the predetermined voltage;

detecting a difference between the voltage level at the first node and the predetermined voltage;

wherein:

the selected memory cell is at either a first state or a second state;

the increasing or decreasing the voltage level at the first node includes:

if the selected memory cell is at the first state, increasing the voltage level;

if the selected memory cell is at the second state, decreasing the voltage level.

18. The method of claim 17 wherein the comparator is configured to receive a second control signal.

19. The method of claim 18, and further comprising:

generating and storing at least an output signal in response to the second control signal;

wherein the output signal is indicative of whether the memory cell is at the first state or the second state.

20. The method of claim 17, wherein the turning off the switch by at least the first control signal includes turning on charge injection cancellation transistors.

* * * * *